United States Patent [19]
Watson

[11] Patent Number: 4,494,169
[45] Date of Patent: Jan. 15, 1985

[54] DECOUPLING CAPACITOR AND METHOD OF MANUFACTURE THEREOF

[75] Inventor: William A. Watson, Mesa, Ariz.

[73] Assignee: Rogers Corporation, Rogers, Conn.

[21] Appl. No.: 551,466

[22] Filed: Nov. 14, 1983

[51] Int. Cl.³ .......................... H01G 1/14; H01G 7/00; H01G 9/00

[52] U.S. Cl. .................................. 361/306; 29/25.42; 361/433

[58] Field of Search ............... 361/306, 321, 322, 392, 361/393, 402, 404, 433; 29/25.42; 174/72 B

[56] References Cited

U.S. PATENT DOCUMENTS

| | | | |
|---|---|---|---|
| 3,312,771 | 4/1967 | Hessinger et al. | 361/392 X |
| 3,588,629 | 6/1971 | Millard et al. | 361/433 |
| 3,880,493 | 4/1975 | Lockhart | 339/147 R |
| 4,266,091 | 5/1981 | Fukuda | 174/72 B |
| 4,356,532 | 10/1982 | Donaher et al. | 361/393 |
| 4,394,713 | 7/1983 | Yoshida | 361/433 |
| 4,399,321 | 8/1983 | Gottlieb | 174/72 B |

FOREIGN PATENT DOCUMENTS

| | | |
|---|---|---|
| 48-87547 | 1/1972 | Japan. |
| 5141864 | 10/1974 | Japan. |
| 53-118043 | 2/1977 | Japan. |
| 5653558 | 6/1978 | Japan. |
| 5552827 | 10/1978 | Japan. |
| 55-112845 | 2/1979 | Japan. |
| 57-197631 | 1/1981 | Japan. |
| 58-20556 | 2/1983 | Japan. |

Primary Examiner—Donald A. Griffin
Attorney, Agent, or Firm—Fishman & Dionne

[57] ABSTRACT

A decoupling capacitor and method of manufacture thereof are presented wherein the decoupling capacitor is formed and consists of a molded housing with integrally molded recesses for a capacitive ceramic chip. The housing also is formed with integrally molded recesses and stabilizing tabs for active pins; and either molded recesses and stabilizing tabs for dummy pins, or molded lugs in lieu of dummy pins.

53 Claims, 13 Drawing Figures

DECOUPLING CAPACITOR AND METHOD OF MANUFACTURE THEREOF

BACKGROUND OF THE INVENTION

This invention relates to the field of decoupling capacitors for integrated circuits. More particularly, this invention relates to a novel and improved decoupling capacitor, and a method of formation thereof particularly adapted to be automatically inserted into printed circuit boards in conjunction with dual-in-line integrated circuits or other electronic components.

U.S. patent application Ser. No. 403,408 (which is assigned to the assignee hereof, and the entire contents of which are incorporated herein by reference) discloses a decoupling capacitor for an integrated circuit package. The decoupling capacitor of that prior application is a thin rectangular chip of ceramic material which is metallized on opposite sides and has leads from the metallized coatings on opposite sides of the chip at two points adjacent a pair of diagonally opposed corners of the rectangularly shaped ceramic chip. The two leads are bent downwardly, and the decoupling capacitor assembly is encapsulated in a film of nonconductive material. In accordance with the teachings of that prior application, the decoupling capacitor is dimensioned so as to be received in the space between the two rows of leads extending from a conventional dual-in-line integrated circuit. The two leads from the decoupling capacitor are plugged into a printed circuit board, with these leads from the capacitor being inserted into the printed circuit through holes to which the ground power supply conductors are connected. The associated integrated circuit or other electronic component is then positioned over the capacitor and inserted into the board such that the power supply leads of the integrated circuit or other component will be positioned in the same through holes of the printed circuit board in which the two capacitor leads have been inserted.

The diagonally located leads or pins on the decoupling capacitor of application Ser. No. 403,408 have resulted in a problem when it is desired to automatically insert the decoupling capacitors into the printed circuit board. Standard auto-insertion equipment is available for inserting integrated circuit elements into the printed circuit boards. The insertion heads on standard auto-insertion equipment grasp the integrated circuit about the bent terminal pins or leads of the integrated circuit. Since there are two symmetric rows of pins on the integrated circuit element, the auto-insertion equipment can grasp the integrated circuit element symmetrically and stably for insertion. However, when insertion of the decoupling capacitor of prior application Ser. No. 403,408 is attempted with the same auto-insertion equipment, an unstable condition and misalignment results because of the fact that the decoupling capacitor, rather than having two symmetrical rows of pins, has only two pins at diagonally opposite corners of the rectangular capacitor. Because of the presence of only the two pins, the capacitor "cocks" in the insertion head with the result that misalignment occurs between the terminals of the capacitor in the corresponding holes on the printed circuit board.

Since it is extremely desirable to auto-insert the decoupling capacitors into the printed circuit boards, and since it is equally desirable to perform that auto-insertion with the same auto-insertion equipment used with the integrated circuit elements, a significant problem is encountered with the decoupling capacitor of the prior application, not from the standpoint of its electronic operability and effectiveness, but rather from the standpoint of adapting it to high volume assembly techniques.

U.S. patent application Ser. No. 456,654 (assigned to the assignee hereof) discloses one approach to solving the above discussed problem by the incorporation of dummy or stabilizing pins in decoupling capacitor assembly. The present invention presents other constructions and methods for both solving the above discussed problem and forming an improved decoupling capacitor construction.

SUMMARY OF THE INVENTION

The above discussed and other problems of the prior art are overcome or substantially reduced by the new and improved decoupling capacitor of the present invention. Also, several additional advantages in design, assembly, cost and quality are realized with the present invention.

In accordance with the present invention, the capacitor ceramic chip is incorporated into a molded plastic housing. The molded housing has an integrally molded recess to receive and contain the capacitive ceramic chip; and the molded plastic housing is also formed with integrally molded recesses and/or stabilizing tabs to permit active and/or dummy pins to pass through the housing. In accordance with the present invention, the assembly may incorporate projecting lugs on the plastic housing in lieu of the dummy pins, or the assembly may incorporate dummy pins. In either event, the dummy pins or projecting lugs are located at diagonally opposite corners to provide a symmetrical pin configuration which eliminates the misalignment problem previously encountered and makes the decoupling capacitor fully suitable for auto insertion into printed circuit boards with standard auto insertion equipment.

The plastic molded housing of the present invention is in the form of two body or housing halves or segments which are assembled and bonded together to complete the final unit. These housing segments are mating segments; and they are formed with various recesses and stabilizing pads depending on which of several possible design configurations are employed. In all configurations, a moisture barrier is incorporated in the assembly, and various assembly components will be adhesively or otherwise bonded together to provide a sealed package.

If projecting lugs are used in lieu of dummy pins, the projecting lugs will be located at diagonally opposite corners of the molded plastic housing (or at such other location as needed to balance the power supply pins), and preferably will be on the same segment of the housing assembly.

If dummy pins are employed, the dummy pins will be locked into the housing assembly, and they may even be premolded into one or both of the housing assembly components.

Regardless of whether dummy pins are employed or projecting lugs are employed in lieu of dummy pins, the active pins of the assembly will be mechanically and/or electrically connected to opposite conductive surfaces of the capacitive element; and these active pins will be positioned in integrally molded recesses and/or passageways in the housing segments and will be firmly held in position by cooperating stabilizing pads on the mating housing segments.

In addition to solving the misalignment problem and being suitable for auto insertion, the decoupling capacitor of the present invention has several other advantages and potentials. The assembly of the present invention is particularly suitable for production in large quantities and presents opportunities for reduced cost (such as in conductors and packaging) with overall improvement in quality.

The present invention will be discussed in the general configuration of a decoupling capacitor having axial symmetry, with a pair of diagonally opposed active terminal pins and a pair of diagonally opposed dummy pins or stabilizing lugs. However, it will be understood that this configuration is described for purposes of illustration of the preferred configuration for use with an integrated circuit having diagonally opposed power supply pins; but the present invention is not limited to this configuration. The decoupling capacitor of the present invention can be configured as may be dictated by the configuration and requirements of the integrated circuit or other electronic component with which it is to be used. Thus, for example, if the power supply pins of the integrated circuit are not at diagonally opposed locations, the dummy pins or stabilizing lugs will be located at such other locations, as may be dictated by the location of the power supply pins, to balance the power supply pins; and the number of active pins of the decoupling capacitor may be more than two (to match an IC having more than two power leads); and the number and location of dummy pins or stabilizing lugs need not always be symmetrical with respect to the active pins; all of the above being within the general requirement that the active leads and dummy pins or stabilizing lugs be arranged to provide an array of stabilized engagement sites or surfaces for stabilized engagement by the jaws of auto insertion equipment.

The above discussed and other advantages of the present invention will be apparent to and understood by those skilled in the art from the following detailed description and drawings.

BRIEF DESCRIPTION OF THE DRAWINGS

Referring now to the several FIGURES of the drawings, wherein like elements are numbered alike in the several FIGURES.

DESCRIPTION OF THE PREFERRED EMBODIMENTS

Figure 1:
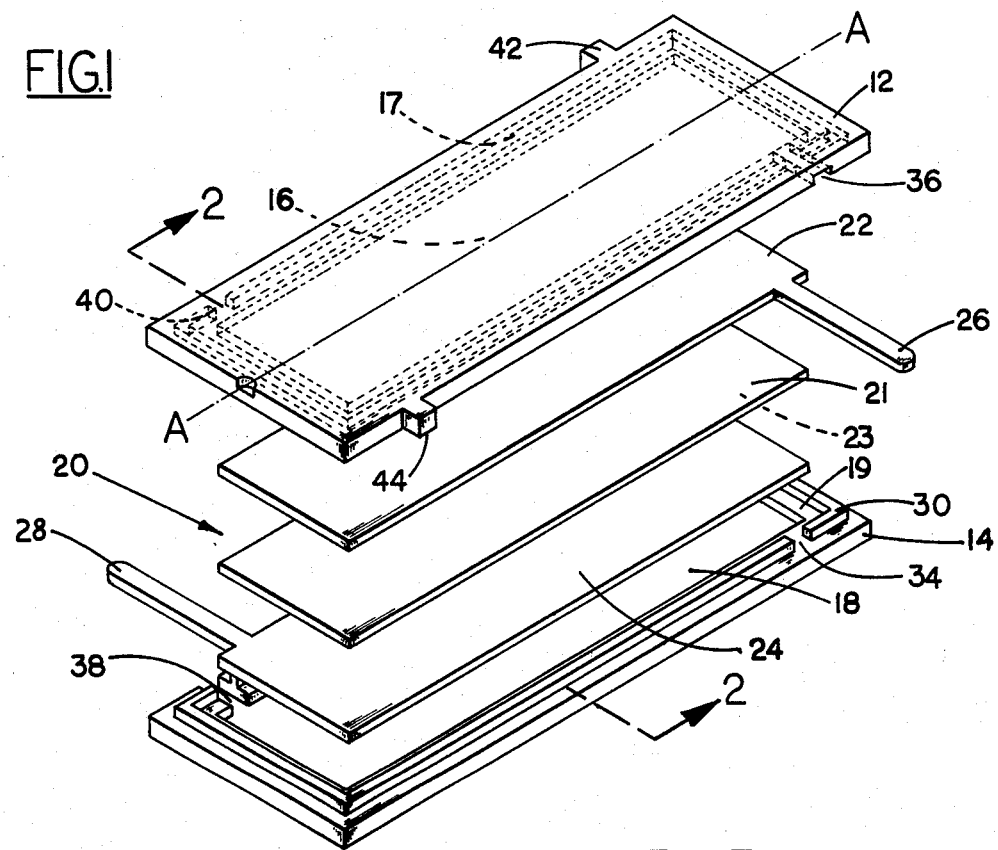
FIG. 1 shows an exploded view of a first embodiment of an improved decoupling capacitor in accordance with the present invention.
Figure 3:
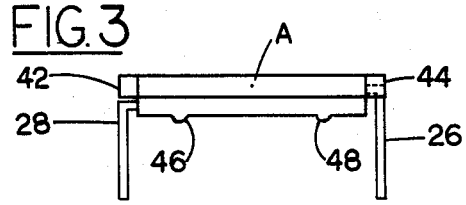
FIG. 3 is an end elevation view of an assembled unit of FIG. 1 after the pins have been bent downward.
Figure 2:
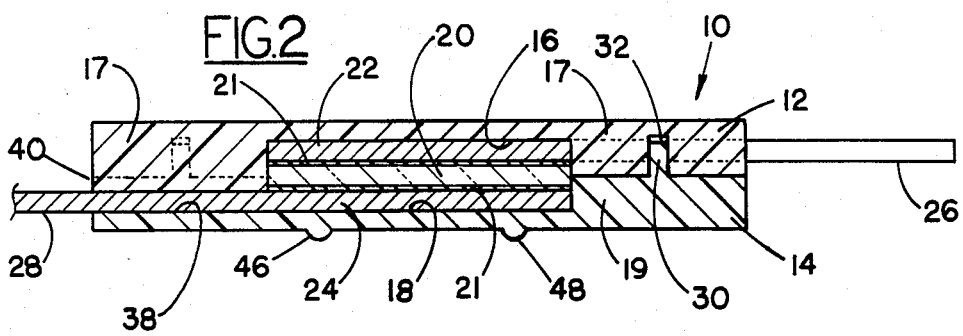
FIG. 2 shows a partial sectional view along line 2—2 of FIG. 1 of an assembled unit.

Referring first to the embodiment of FIGS. 1-3, the decoupling capacitor of the present invention has a housing 10 made up of mating first and second housing segments 12 and 14, which may be referred to as upper and lower housing segments, respectively, since in the principal intended application, segment 14 would be adjacent to a printed circuit board, and housing segment 12 would be on top of housing segment 14. Housing segments 12 and 14 are molded from suitable thermoplastic or thermosetting molding materials. Upper and lower housing segments 12 and 14 are each formed with a recess or pocket 16 and 18, respectively, which cooperate to define an interior cavity for housing a ceramic chip capacitor element.

In the embodiment of FIGS. 1-3, the ceramic chip capacitor element is comprised of a rectangularly shaped ceramic capacitor element 20 positioned between rectangularly shaped conductive plates 22 and 24. Ceramic chip 20 may, for example, be barium titanite or strontium titanite, and it has conductive upper and lower face surfaces 21 and 23 which may be nickel alloy (as disclosed in U.S. application Ser. No. 391,967 assigned to the assignee hereof and which is incorporated herein by reference). Plates 22 and 24 may be copper plates which may also be plated with nickel or nickel alloy; and the plates 22 and 24 are in physical and electrical contact with conductive face surfaces 21 and 23, respectively. Plates 22 and 24 may be bonded to capacitor faces 21 and 23 by electrically conductive adhesive; or nonconductive adhesive may preferably be employed, with electrical contact being effected by differential surface roughness between plates 22 and 24 and surfaces 21 and 23, as described in U.S. Pat. No. 4,236,038, which is assigned to the assignee hereof and which is incorporated herein by reference. The capacitor assembly of conductor plates 22 and 24 with ceramic element 20 sandwiched therebetween are formed and bonded into a completed subassembly prior to being incorporated into the plastic housing. As can perhaps best be seen in FIG. 2, the capacitor subassembly is housed in the cavity defined by recesses 16 and 18 and peripheral borders 17 and 19 which run around the outer portions of segments 12 and 14, respectively. The capacitor assembly is sized to occupy all of the cavity, with plate 22 being in recess 16, plate 24 being in recess 18, and the ceramic chip 20 bridging the recesses.

A contact terminal or pin 26 extends from plate 22 adjacent one end thereof, and a contact terminal or pin 28 extends from plate 24 adjacent one end thereof. The terminals 26 and 28 extend beyond the plastic housing adjacent diagonally opposite corners of the assembled housing, through appropriately preformed passageways in the housing, as can best be seen in FIG. 1.

Lower housing segment 14 has an upwardly projecting sealing rib 30 which mates with a recess 32 in border section 17 of upper housing segment 12. Sealing rib 30 and recess 32 mate in a tongue and groove fashion to form a moisture barrier. This rib and groove structure extends entirely around the peripheral border area of the respective housing segments except where interruption is necessary to permit the contact terminals 26 and 28 to pass through the housing. As can be seen in FIG. 1, rib 30 is interrupted at passage 34, and a passage 36 is formed in upper housing segment 12 which interrupts recess or groove 32; and passages 34 and 36 cooperate to define a passageway to permit pin 26 to pass through the housing. A passage 38 is also formed in lower housing segment 14 to permit pin 28 to pass through the housing. Passage 38 is formed through rib 30 and border section 19, but it is not necessary to form a passage in upper housing segment 12 for pin 28. Pin 26 occupies all of passage 34 and passage 36, so the moisture barrier effect is not lost at that location. Also, upper housing segment 12 has a small downwardly projecting pad 40 which mates with the portion of passage 38 above contact 28 when the contact is in position. Thus, as can best be seen in FIG. 2, pad 40 mates with the upper portion of passage 38 and bears against the upper portion of contact 28 to continue the sealing and moisture barrier effect at that location.

Upper housing segment 12 is formed with a pair of projecting lugs 42 and 44 at locations to balance pins 26 and 28, those locations being adjacent diagonally opposite corners of the housing in the embodiment of FIGS. 1 and 2. Lug 42 is on the opposite side of the unit from pin 26, and lug 44 is on the opposite side of the unit from pin 28 at the same major axes locations of the pins. Thus, pins 26 and 28 are at one pair of diagonally opposite stations in the unit, and lugs 42 and 44 are at a corresponding other pair of diagonally opposite locations in the unit in balance with pins 26 and 28. The lugs 42 and 44 are stabilizing lugs which take the place of pins which will otherwise be required (such as dummy pins as set forth in U.S. application Ser. No. 456,654) to stabilize the unit during auto insertion.

As can be seen in FIGS. 2 and 3, the unit is also formed with risers 46 and 48 on the outer surface of lower housing segment 14, which may be either ribs or a series of semi-cylindrical or semi-spherical buttons. These risers are located between the decoupling capacitor and the PC board and serve to elevate the housing slightly above the PC board on which it is to be mounted for cooling purposes and/or for cleaning the PC board. If space permits, similar ribs or buttons may be formed on the outer surface of upper housing segment 12 to be between the decoupling capacitor and the IC to permit cleaning of the IC.

In the assembly of the unit, the capacitor subassembly of chip 30 and conductive plates 22 and 24 with pins 26 and 28 is first formed, with the plates 22 and 24 being adhesively bonded to opposite surfaces of ceramic chip 20. The adhesive is, preferably, a nonconductive adhesive, with electrical contact being effected by differential surface roughness in accordance with the teachings of U.S. Pat. No. 4,236,038, the entire contents of which are incorporated herein by reference. Alternatively, conductive adhesive can be used. That capacitor subassembly is then positioned in recess 18 of lower housing segment 14; and upper housing segment 12 is then placed on top of segment 14, with sealing rib 30 and groove 32 in interlocking tongue and groove engagement. Adhesive is placed between the plates 22 and 24 and the facing surfaces or floors of pockets 16 and 18 to lock the capacitor subassembly in place. The opposed facing surfaces of borders 17 and 19 are also coated with a suitable adhesive to adhesively bond the housing segments 12 and 14 together; and the outer surfaces of plates 22 and 24 may be adhesively bonded to recesses 16 and 18. After the unit has been assembled and at any time before insertion of the unit in a PC board, pins 26 and 28 are bent downwardly, as shown in FIG. 3 (it being understood the bend may be something less than 90° shown in FIG. 3). Lugs 42 and 44 are sized so that their outward projection is equal to the outward projection of pins 26 and 28 after the pins have been bent down. Thus, the unit is balanced and has an axial symmetry about axis A—A which makes the unit suitable for use with auto insertion equipment wherein the jaws of an auto insertion mechanism will grasp the housing about the two sides, i.e., with one jaw of the housing engaging pin 28 and lug 42 and the other jaw of the housing engaging pin 26 and lug 44. The presence of lugs 42 and 44 endows the unit with jaw engaging surfaces at all four corners, thus rendering the unit stable when it is within the confines of the jaws of an auto insertion machine.

Figure 4:
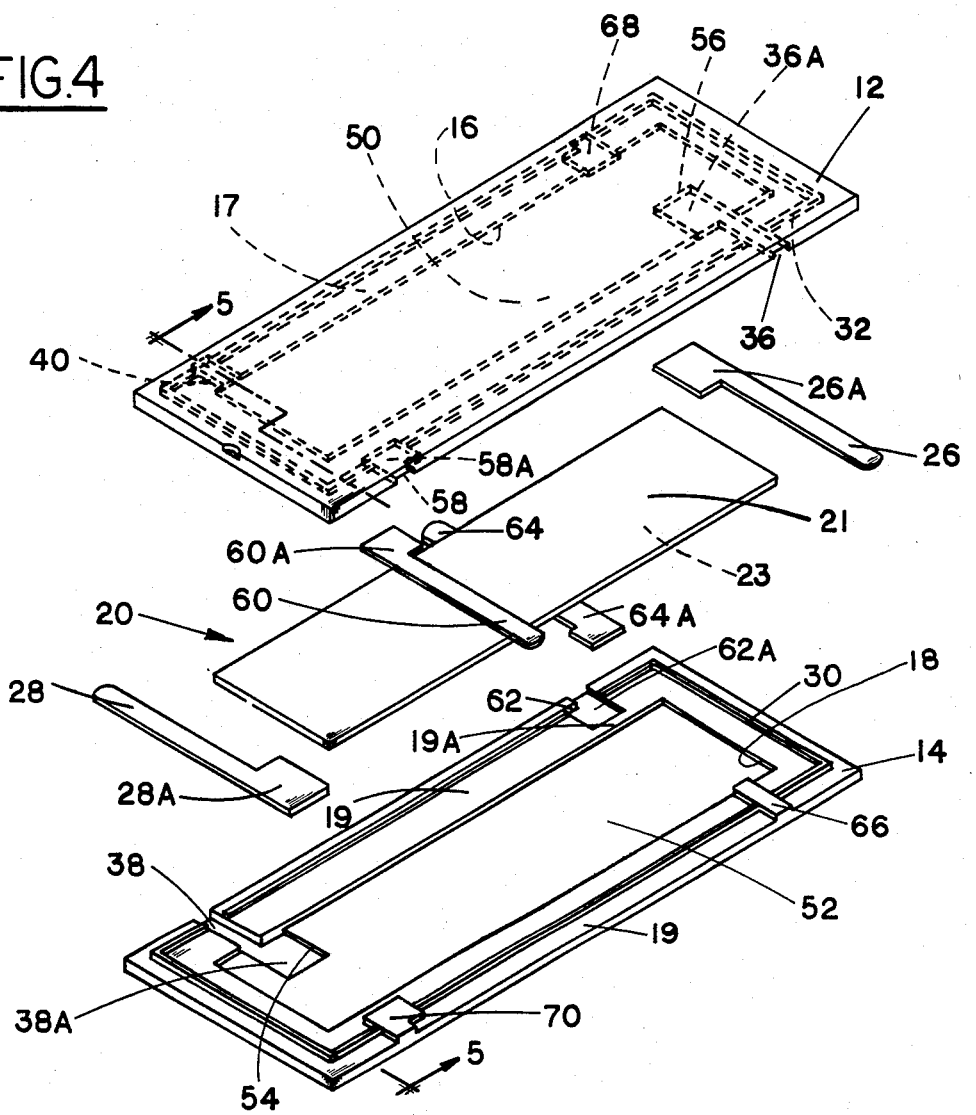
FIG. 4 shows an exploded view of a second embodiment of the present invention incorporating dummy pins.
Figure 5:
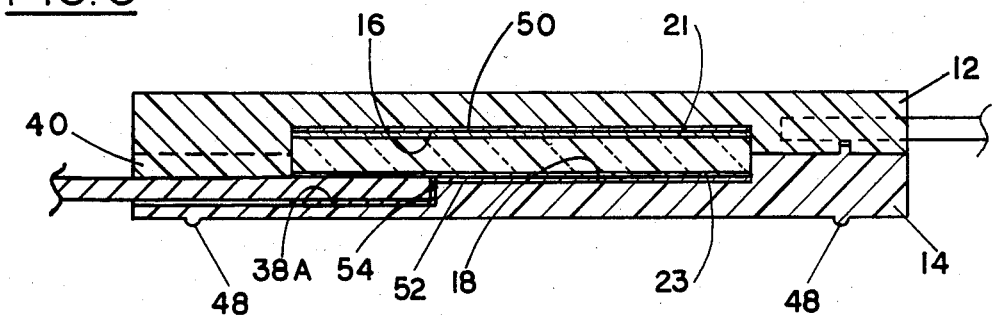
FIG. 5 shows a sectional elevation view along line 5—5 of FIG. 4.

Referring now to FIGS. 4 and 5, another embodiment of the present invention is shown. The major differences between the embodiment of FIGS. 4 and 5 and that of FIGS. 1–3 are (1) elimination of conductor plates 22 and 24, which are replaced by conductive material in the recesses of the housing segments, and (2) the use of dummy pins instead of the projecting lugs 42 and 44. In the embodiment of FIGS. 4 and 5, the surfaces of recesses 16 and 18 are each coated with an electrically conductive material 50 and 52. These electrically conductive coatings 50 and 52 may be deposited by electroplating, or they may be a conductive adhesive or paste, or they may be formed by bonding a metallic foil, such as copper, to the surfaces 16 and 18. The capacitor element is housed in these recesses with its conductive surfaces 21 and 23 in electrical contact with the conductive surfaces 50 and 52. The capacitor element is adhesively bonded to the conductive surfaces 50 and 52 to effect electrical and mechanical connection. The adhesive is, preferably, a nonconductive adhesive, with electrical contact being effected by differential surface roughness in accordance with U.S. Pat. No. 4,236,038. Alternatively, conductive adhesive can be used. The passageway 38 communicates with an enlarged rectangular pocket 38A which is stepped below the surface of recess 18 and is joined to surface 18 via a shoulder or step 54. The upper surfaces of passage 38, pocket 38A and shoulder 54 are also coated with the conductive material 52. Similarly, passageway 36 leads to an enlarged rectangular pocket 36A which is further recessed relative to the surface of recess 16, with a step or shoulder 56 between the surfaces 36A and 16. Passageway 38 and pocket 38A receive terminal pin 28 which has an enlarged rectangular end 28A corresponding in size and shape to pocket 38A. Similarly, passageway 36 and pocket 36A receive terminal pin 26 which has an enlarged rectangular end 26A corresponding in size and shape to pocket 36A. The surface of pocket 38A and shoulder 56 are also coated with the conductive material 50. Border area 17 is provided with a recessed passage 58 and an enlarged recess pocket 58A to receive a dummy pin 60 with an enlarged end portion 60A. Also, border area 19 has formed therein a passageway 62 with an enlarged rectangular pocket 62A to receive a dummy pin 64 which has enlarged end 64A. Border area 19 is formed with a raised pad 66 which interlocks with passage 36, in the same manner that raised pad 40 of border area 17 interlocks with passage 38. Similarly, border area 17 is formed with a pad 68 which is shaped like and interlocks with passage 62 and pocket 62A; and border area 19 is formed with a pad 70 which is shaped like and interlocks with passage 58 and recess 58A.

In the formation and assembly of the unit of FIGS. 4 and 5, the housing components are molded. Then, the conductively coated surfaces identified above are coated with conductive material. Contact terminal 28 is then placed in position to extend through passage 38, with terminal segment 28A housed in recess portion 38A. The conductive or nonconductive adhesive is then coated onto either chip surfaces 21 and 23 or recess surfaces 50 and 52. Recesses 36A or the parts of pads 26A and 28A contacted therewith may be coated with a conductive adhesive. Ceramic capacitor chip element 20 is then placed in recess 18 with conductive surface 21 in contact with conductive surface 52. Next, contact terminal pin 26 is placed in passage 36, with enlarged portion 26A being received in cavity 36A. The dummy pins 60 and 64 are then placed in their respective passages 58 and 62, with their respective enlarged portions 60A and 64A being received in recesses 58A and 62A, and adhesively bonded thereto. Top housing segment 12 is then placed on top of bottom housing segment 14, with sealing rib 30 interlocking in tongue and groove arrangement with peripheral recess 32. The various pads are then engaged with their mating recesses, with pad 40 engaging passage 38 on top of pin 28, pad 66 engaging passage 36 beneath pin 26, pad 68 engaging passage 62 and pocket 62A on top of dummy pin 64 and pad 70 engaging passage 58 and enlarged recess 58A beneath dummy pin 60. The border areas 17 and 19, the tongue 30 and/or groove 32, and the various stabilizing pads may be coated with an appropriate adhesive to entirely seal the assembly and complete the moisture barrier structure and mechanism.

It will be noted that the pocket 62A and the pocket 58A do not extend all the way through their respective border areas 19 and 17. That is, a portion of each of the border areas separates these recesses in the main body recesses 18 and 16. One such border portion 19A is clearly visible in FIG. 4 showing the separation between pocket 62A and recess 18; and a similar border portion in border 17 separates pocket 58 from main body recess 16. The separation of pockets 58A and 62A from the main body recesses insures that the dummy pins 60 and 64 are mechanically and electrically isolated from the capacitor chip and any of the conductive surfaces. This insures that the dummy pins remain electrically isolated so that they serve only to provide geometric balance and as mechanical stabilizers for auto insertion. It will also be understood that the mating between the various pads 40, 66, 68 and 70 and their mating recesses or passageways serves to lock and stabilize the contact pins and dummy pins in place mechanically as well as providing pressure surfaces to urge the contact terminal pins 26 and 28 and their enlarged end portions into conductive contact with the conductive surfaces in their respective recesses. As can be seen and understood from the drawings in the foregoing description, the enlarged surface 28A of pin 28 is in mechanical and electrical contact with the conductive surface of pocket 38A, thus putting that pin in electrical contact with surface 52 which is in contact with conductive surface 23 of the capacitive element. Similarly, the enlarged portion 26A of pin 26 is in mechanical and electrical contact with the conductive surface of recess 36A so that pin 26 is electrically connected to conductive surface 50 which is, in turn, mechanically and electrically connected to conductive surface 23A of capacitive chip 20. Thus, the pins 26 and 28 are connected across the opposite surfaces of the capacitor to provide decoupling capacitance when connected into a circuit.

The final step in assembly of the embodiment of FIGS. 4 and 5 will be to bend the active and dummy pins 90° downwardly (as with pins 26 and 28 in FIG. 3). The unit is then ready for insertion into a printed circuit board, with the active and dummy pins providing geometric balance and axial symmetry for the unit to be engaged by the jaws of auto insertion machinery.

It will be noted that the dummy pins 60 and 64 could be integrally molded into the housing at the time of molding of the housing rather than placing them in position during assembly as described above.

Figure 4A:
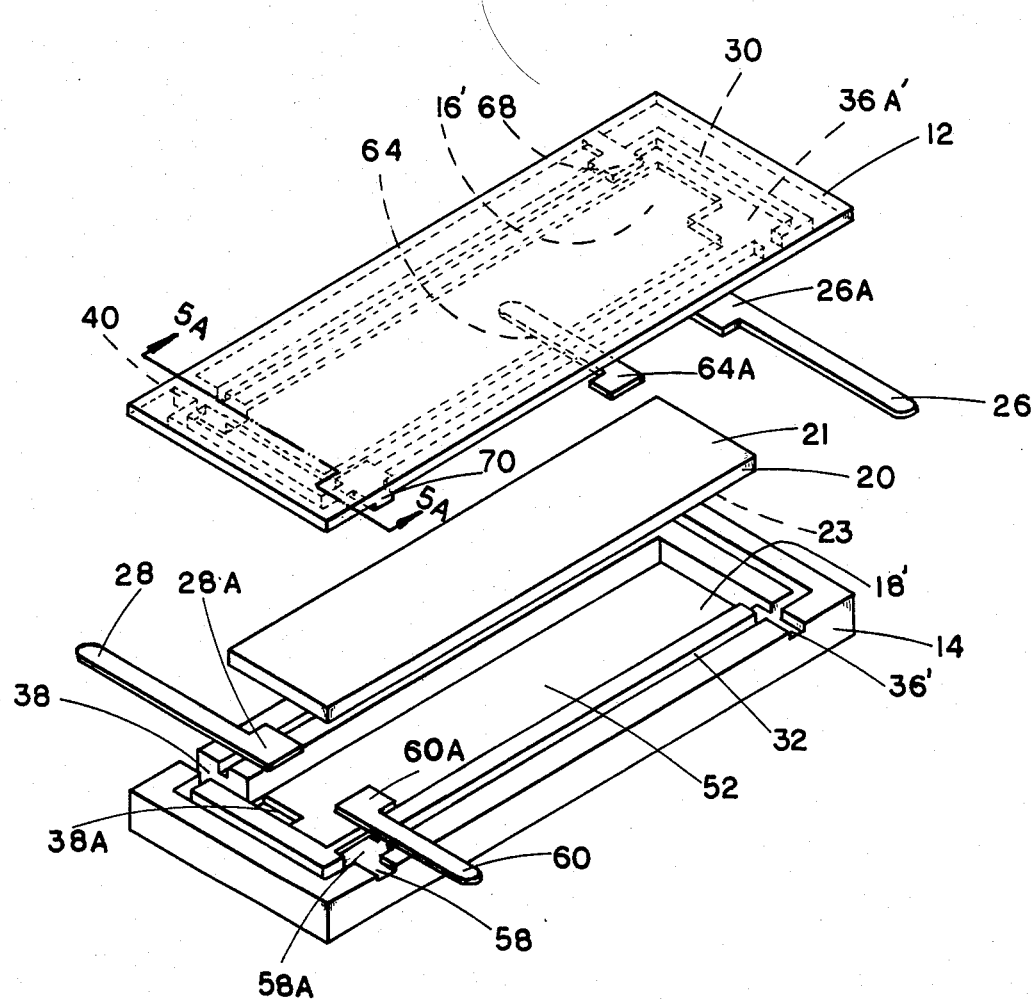
FIGS. 4A and 5A show a variation of the embodiments shown in FIGS. 4 and 5.
Figure 5A:
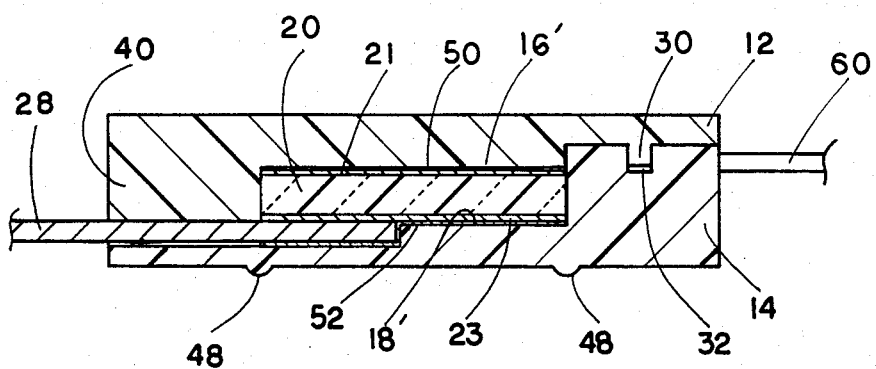

Referring now to FIGS. 4A and 5A, a modified version of the unit of FIGS. 4 and 5 is shown. The principal difference between these units is that the entire cavity for receiving the capacitor element (ceramic element 20 with conductive surfaces 21 and 23) is cavity 18' in bottom housing segment 14, and top housing segment 12 has a projecting center pad 16'. Recess 18' has the conductively coated surface 52 thereon, and center pad 16' has the conductively coated surface 50 thereon. The passage 58 and pocket 58A to receive dummy pin 60 and rectangular end 60A are in lower housing segment 14, while the stabilizing pad 70 is in upper housing segment 12. The tongue 30 projects from upper housing segment 12 to mate with the groove 32 which is in lower housing segment 14. Also, active pin 26 passes through a passage 36' in lower housing 14, and pin end 26A sits on top of surface 21 and is received in a pocket 36A' formed in upper housing segment 12 between projecting center pad 16' and tongue 30. The remainder of the construction and assembly of the embodiment of FIGS. 4A and 5A is as in FIGS. 4 and 5.

Figure 6:
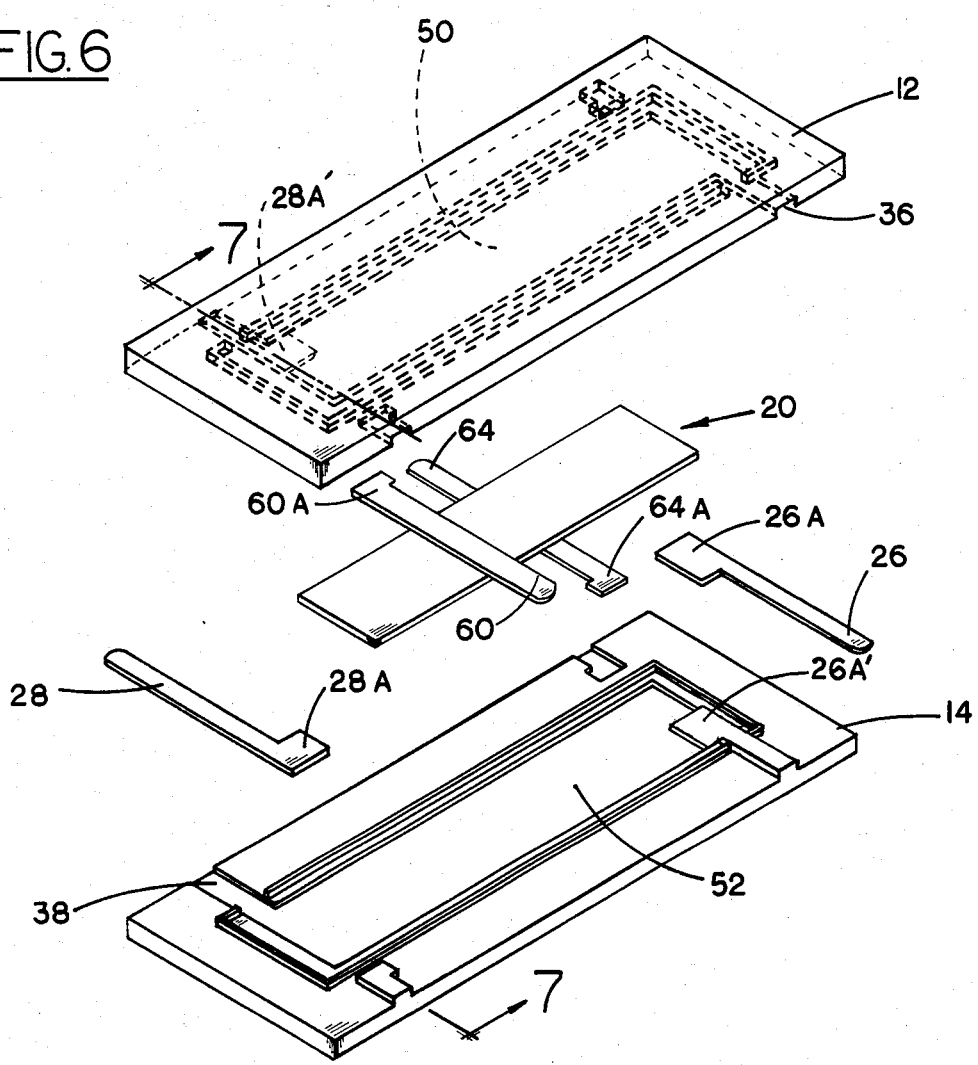
FIG. 6 shows an exploded view of a variation of the embodiment of FIG. 4.
Figure 7:
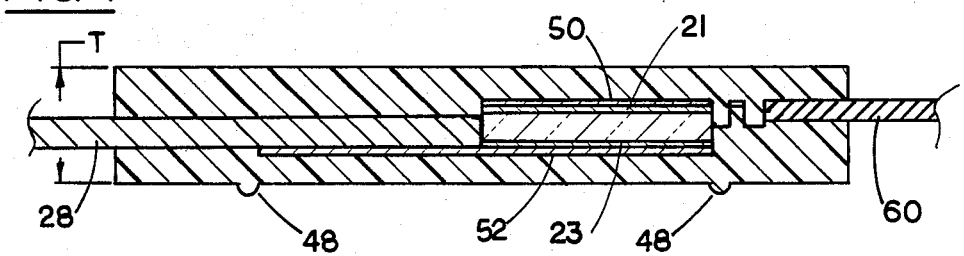
FIG. 7 is a sectional elevation view along line 7—7 of an assembled version of FIG. 6.

Referring now to FIGS. 6 and 7, another embodiment of the decoupling capacitor of the present invention is shown. The embodiment of FIGS. 6 and 7 is a "slimline" version of the embodiment of FIGS. 4 and 5. The principal difference in the embodiment of FIGS. 6 and 7 relative to the embodiment of FIGS. 4 and 5 is that the active pins are directly positioned on flat electrically conductive surfaces in the respective housing segments. Thus, active pin 28 is positioned in passage 38 with the enlarged end 28A contacted by pad 28A' to position end 28A directly on and in physical and electrical contact with surface 52. Similarly, active pin 26 is located in passage 36, and the enlarged end 26A of that active pin is contacted by pad 26A' to position end 26A in direct physical and electrical contact with conductive surface 50 of upper housing segment 12 (as shown in phantom in FIG. 6). This construction permits the overall thickness T of the unit to be somewhat reduced, thus resulting in the "slimline" designation.

Figure 8:
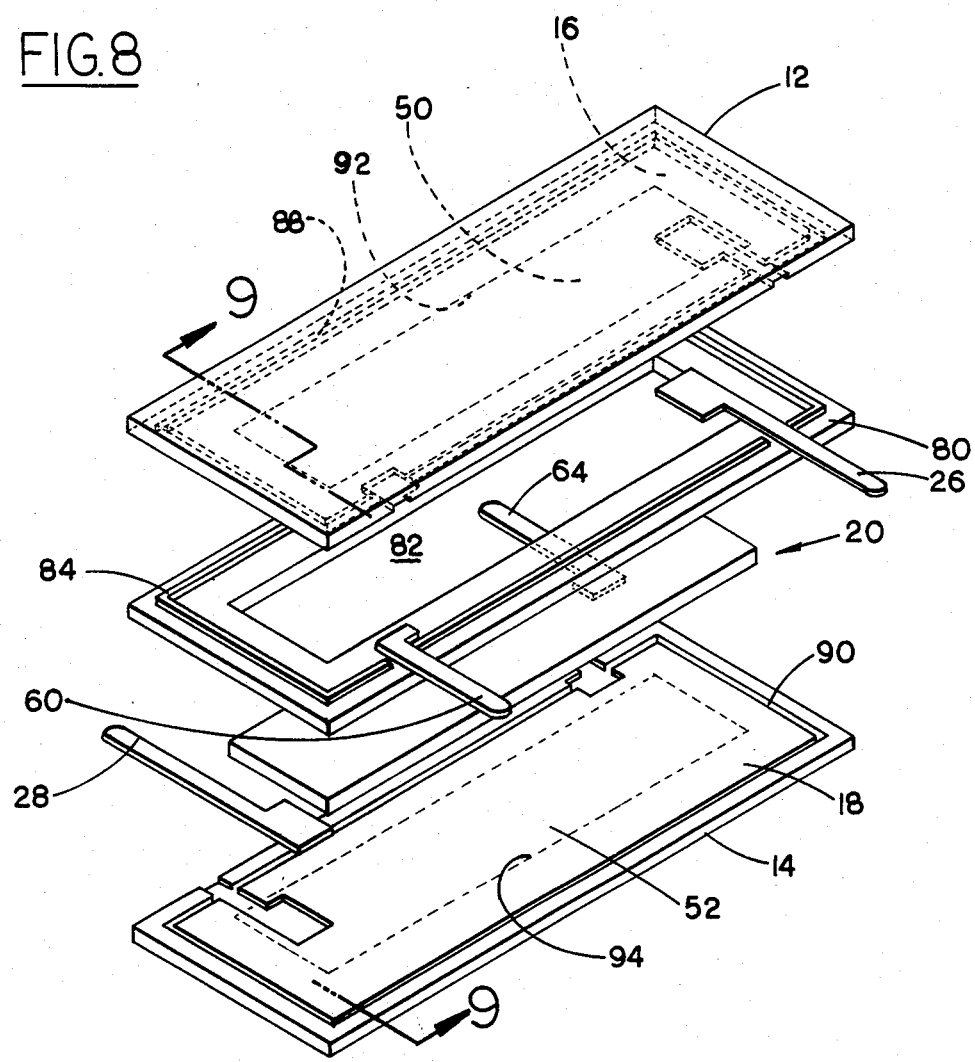
FIG. 8 shows an exploded view of still another embodiment of this present invention.
Figure 9:
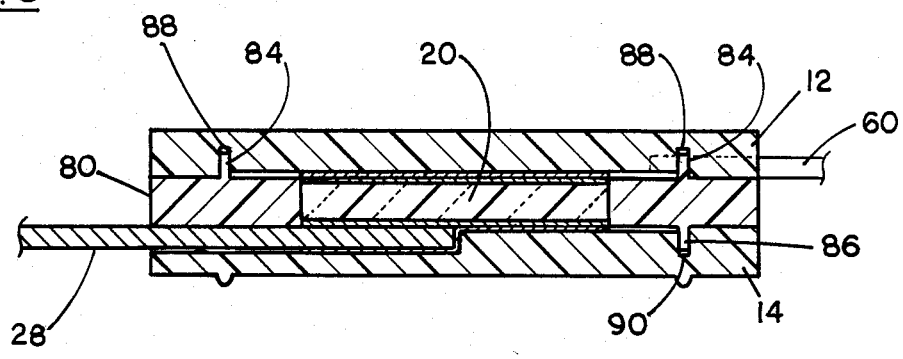
FIG. 9 shows a sectional elevation view taken along line 9—9 of an assembled version of FIG. 8.

Referring now to the embodiment of FIGS. 8 and 9, this embodiment differs from that of FIGS. 4 and 5 primarily by the addition of an insulating spacer 80 which is incorporated in the assembly between upper and lower housing segments 12 and 14. This spacer may be a molded or blanked section, and it serves as a border or housing for ceramic capacitor element 20 which is positioned and housed in the central opening 82. Spacer 80 has the same exterior dimensions as upper and lower housing segments 12 and 14; and when the unit is assembled spacer 80 is sandwiched between housing segments 12 and 14 to separate the housing elements and define an interior cavity in which capacitive element 20 is located. Moisture sealing ribs 84 and 86 project from the upper and lower surfaces, respectively of spacer 80, and these ribs mate in tongue and groove fashion with grooves 88 and 90 in the upper and lower housing segments, respectively. The moisture barrier ribs and grooves extend around the entire peripheries of their respective elements, except where they may be interrupted for passageways or stabilizing pads for the active and dummy pins. In the embodiment of FIGS. 8 and 9, the interior surfaces 16 and 18 of the upper and lower housing segments are conductively coated only in that part or area 50 and 52 which is to be in contact with the conductively coated faces of capacitor chip element 20 and the respective active pins. These conductive areas of surfaces 16 and 18 are indicated by the dashed lines 92 and 94 and correspond, essentially, to the area of interior opening 82 of spacer 80.

In the embodiment of FIGS. 8 and 9, the capacitor chips will also be bonded to the conductively coated areas 50 and 52 by nonconductive adhesive (as per U.S. Pat. No. 4,236,038) or by conductive adhesive.

Figure 10:
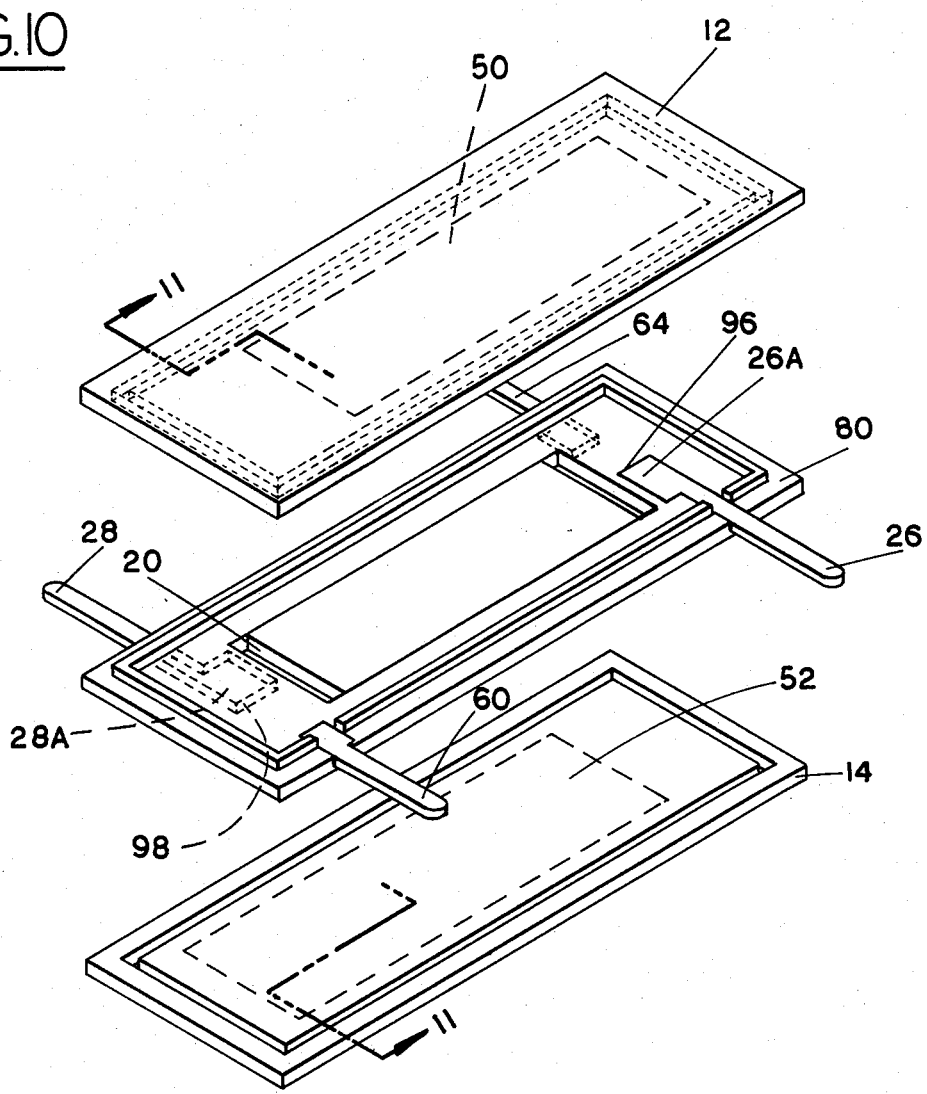
FIG. 10 shows an exploded view of a variation of the embodiment of FIG. 8.
Figure 11:
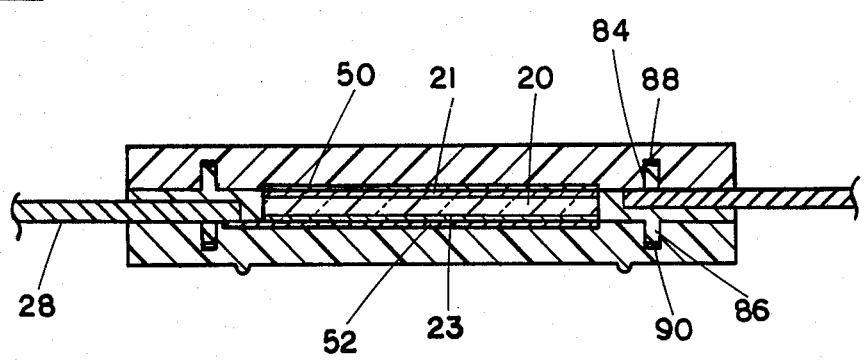
FIG. 11 is a sectional elevation view along line 11—11 of an assembled version of FIG. 10.

Referring now to FIGS. 10 and 11, another embodiment is shown. The embodiment of FIGS. 10 and 11 is a "slimline" version of the embodiment of FIGS. 8 and 9. The principal difference in the embodiment of FIGS. 10 and 11 relative to the embodiment of FIGS. 8 and 9 is that the active pins are housed in recesses in spacer 80 and are in direct contact with the electrically conductive surfaces on the respective housing segments. Thus, active pin 26 is positioned in a recess 96 in the top of spacer 80 and is in direct electrical contact with conductive surface 50. Similarly, active pin 28 is in a recess 98 in the bottom of spacer 80 and is in direct electrical contact with the conductive surface 52. In the embodiment of FIGS. 10 and 11, the conductive surface 50 must overlap part of spacer 80 at the end where recess 96 is located, the overlap being enough to cover pin end 26A; and the conductive surface 52 must overlap part of spacer 80 at the end where recess 98 is located, the overlap being enough to cover pin end 28A. As with all previous embodiments, conductive or nonconductive adhesive may be employed between capacitor surfaces 21 and 23 and conductive surfaces 50 and 52; conductive adhesive may be employed between pin ends 26A and 28A and the conductive surfaces they contact; and nonconductive adhesive may be employed between the housing segments and between the housing segments and spacer 80.

In all embodiments, adhesive is included in the tongue and groove moisture barrier structure, to enhance both the physical interlock of the housing segments and the moisture barrier effect. In addition or alternatively, the housing segments can be ultrasonically bonded. Also, the pins (active and dummy) could each be located and retained on one or more pins in the housing segments which engage mating holes in the pins.

While preferred embodiments have been shown and described, various modifications and substitutions may be made thereto without departing from the spirit and scope of the invention. Accordingly, it is to be understood that the present invention has been described by way of illustrations and not limitation.

What is claimed is:

1. A capacitor including:
a first molded housing segment;
a first border segment around the periphery of said first molded housing segment;
a second molded housing segment;
a second border segment around the periphery of said second molded housing segment;
said first and second border segments being in facing and abutting contact and being bonded together;
a recess in at least one of said molded housing segments;
said first and second molded housing segments cooperating to define within said border segments an interior cavity having opposed first and second face surfaces, said first face surface being on said first molded housing segment and said second face surface being on said second molded housing segment;
first electrically conductive means associated with said first face surface;
second electrically conductive means associated with said second face surface;
a flat dielectric element in said cavity, said dielectric element having first and second opposed faces, with a first electrically conductive layer on said first face and a second electrically conductive layer on said second face;
said first electrically conductive means being physically and electrically connected to at least part of said first electrically conductive layer and said second electrically conductive layer and said second electrically conductive means being connected to at least part of said second electrically conductive layer;
said first electrically conductive means including a first terminal pin extending therefrom;
said second electrically conductive means including a second terminal pin extending therefrom;
moisture barrier means in said first and second border segments; and
passage means in at least one of said border segments for passage of said first and second terminal pins.

2. The capacitor of claim 1 including:
at least one stabilizing pad on at least one of said housing segments, said stabilizing pad cooperating with a passage means to define the passage area for a terminal pin.

3. The capacitor of claim 1 including:
first and second inactive pins retained in said housing segments, said inactive pins being positioned to be electrically isolated from said first and second electrically conductive means and said first and second electrically conductive layers on said dielectric element and to balance said first and second terminal pins.

4. The capacitor of claim 3 including:
stabilizing pads on at least one of said first and second housing segments, said stabilizing pads cooperating with passage means to define passage areas for terminal pins and/or inactive pins.

5. The capacitor of claim 1 including:
first and second projecting lugs, said lugs being on at least one of said housing segments, said lugs being positioned to balance said first and second terminal pins.

6. The capacitor of claim 1 wherein:
said first electrically conductive means is a first electrically conductive plate physically and electrically connected to said first electrically conductive layer on said dielectric element; and said second electrically conductive means in a second electrically conductive plate physically and electrically connected to said second electrically conductive layer on said dielectric element.

7. The capacitor of claim 6 wherein:

said first terminal pin is an integral part of said first plate; and said second terminal pin is an integral part of said second plate.

8. The capacitor of claim 6 including:

at least one stabilizing pad on at least one of said housing segments, said stabilizing pad cooperating with a passage means to define the passage area for a terminal pin.

9. The capacitor of claim 6 including:

first and second inactive pins retained in said housing segments, said inactive pins being positioned to be electrically isolated from said first and second electrically conductive means and said first and second electrically conductive layers on said dielectric element and to balance said first and second terminal pins.

10. The capacitor of claim 9 including:

stabilizing pads on at least one of said first and second housing segments, said stabilizing pads cooperating with passage means to define passage areas for terminal pins and/or inactive pins.

11. The capacitor of claim 6 including:

first and second projecting lugs, said lugs being on at least one of said housing segments, said lugs being positioned to balance said first and second terminal pins.

12. The capacitor of claim 1 wherein:

said interior cavity is defined by a first recess in said first housing segment and a second recess in said second housing segment;

said first electrically conductive means is a first electrically conductive plate at least partly contained in said first recess and physically and electrically connected to said first electrically conductive layer on said dielectric element; and said second electrically conductive means is a second electrically conductive plate at least partly contained in said second recess and physically and electrically connected to said second electrically conductive layer on said dielectric element.

13. A capacitor including:

a first molded housing segment;

a first border segment around the periphery of said first molded housing segment;

a second molded housing segment;

a second border segment around the periphery of said second molded housing segment;

said first and second border segments being in facing and abutting contact and being bonded together;

a recess in at least one of said molded housing segments;

said first and second molded housing segments cooperating to define within said border segments an interior cavity having opposed first and second face surfaces, said first face surface being on said first molded housing segment and said second face surface being on said second molded housing segment;

a first layer of electrically conductive material on said first face surface of said first housing segment;

a second layer of electrically conductive material on said second face surface of said second housing segment;

a flat dielectric element in said cavity, said dielectric element having first and second opposed faces, with a first electrically conductive layer on said first face and a second electrically conductive layer on said second face;

said first layer of electrically conductive material on said first face surface of said first housing segment being physically and electrically connected to said first electrically conductive layer on said dielectric element and said second layer of electrically conductive material on said second face surface of said second housing segment being physically and electrically connected to said second electrically conductive layer on said dielectric element;

first electrically conductive terminal pin means electrically connected to said first layer of electrically conductive material on said first face surface of said first housing element;

second electrically conductive terminal pin means electrically connected to said second layer of electrically conductive material on said second face surface of said second housing element;

moisture barrier means in said first and second border segments; and passage means in at least one of said border segments for passage of said first and second terminal pins.

14. The capacitor of claim 13 including:

at least one stabilizing pad on at least one of said housing segments, said stabilizing pad cooperating with a passage means to define the passage area for a terminal pin.

15. The capacitor of claim 13 including:

first and second inactive pins retained in said housing segments, said inactive pins being positioned to be electrically isolated from said first and second electrically conductive means and said first and second electrically conductive layers on said dielectric element and to balance said first and second terminal pins.

16. The capacitor of claim 15 including:

stabilizing pads on at least one of said first and second housing segments, said stabilizing pads cooperating with passage means to define passage areas for terminal pins and/or inactive pins.

17. The capacitor of claim 13 including:

first and second projecting lugs, said lugs being on at least one of said housing segments, said lugs being positioned to balance said first and second terminal pins.

18. The capacitor of claim 13 wherein:

said first face surface of said first housing segment includes a first pocket area, with said first layer of electrically conductive material extending into said first pocket area;

said second face surface of said second housing segment includes a second pocket area, with said second layer of electrically conductive material extending into said second pocket area;

said first electrically conductive terminal pin means includes a connector section received in said first pocket area and in electrical contact with said first layer of electrically conductive material in said first pocket area; and said second electrically conductive terminal pin means includes a connector section received in said second pocket area and in electrical contact with said second layer of electrically conductive material in said second pocket area.

19. The capacitor of claim 18 including:
at least one stabilizing pad on at least one of said housing segments, said stabilizing pad cooperating with a passage means to define the passage area for a terminal pin.

20. The capacitor of claim 18 including:
first and second inactive pins retained in said housing segments, said inactive pins being positioned to be electrically isolated from said first and second electrically conductive means and said first and second electrically conductive layers on said dielectric element and to balance said first and second terminal pins.

21. The capacitor of claim 20 including:
stabilizing pads on at least one of said first and second housing segments, said stabilizing pads cooperating with passage means to define passage areas for terminal pins and/or inactive pins.

22. The capacitor of claim 18 including:
first and second projecting lugs, said lugs being on at least one of said housing segments, said lugs being positioned to balance said first and second terminal pins.

23. A capacitor including:
a first molded housing segment;
a first border segment around the periphery of said first molded housing segment;
a second molded housing segment;
a second border segment around the periphery of said second molded housing segment;
said first and second border segments being in facing and abutting contact and being bonded together;
a recess in at least one of said molded housing segments;
said first and second molded housing segments cooperating to define within said border segments an interior cavity having opposed first and second face surfaces, said first face surface being on said first molded housing segment and said second face surface being on said second molded housing segment;
a first layer of electrically conductive material on said first face surface of said first housing segment;
a second layer of electrically conductive material on said second face surface of said second housing segment;
a flat dielectric element in said cavity, said dielectric element having first and second opposed faces, with a first electrically conductive layer on said first face and a second electrically conductive layer on said second face;
said first layer of electrically conductive material on said first face surface of said first housing segment being physically and electrically connected to said first electrically conductive layer on said dielectric element and said second layer of electrically conductive material on said second face surface of said second housing segment being physically and electrically connected to said second electrically conductive layer on said dielectric element;
first electrically conductive terminal pin means electrically connected to said first layer of electrically conductive material on said first face surface of said first housing element;
second electrically conductive terminal pin means electrically connected to said second layer of electrically conductive material on said second face surface of said second housing element;
spacer means between said first and second housing segments, said spacer means having a central opening in which said dielectric element is located;
moisture barrier means between said spacer means and each of said first and second housing segments; and
passage means in at least one of said border segments on said spacer means for passage of said first and second terminal pins.

24. The capacitor of claim 23 including:
at least one stabilizing pad on at least one of said housing segments, said stabilizing pad cooperating with a passage means to define the passage area for a terminal pin.

25. The capacitor of claim 23 including:
first and second inactive pins retained in said housing segments, said inactive pins being positioned to be electrically isolated from said first and second electrically conductive means and said first and second electrically conductive layers on said dielectric element and to balance said first and second terminal pins.

26. The capacitor of claim 25 including:
stabilizing pads on at least one of said first and second housing segments, said stabilizing pads cooperating with passage means to define passage areas for terminal pins and/or inactive pins.

27. The capacitor of claim 23 including:
first and second projecting lugs, said lugs being on at least one of said housing segments, said lugs being positioned to balance said first and second terminal pins.

28. The capacitor of claim 23 wherein:
said first face surface of said first housing segment includes a first pocket area, with said first layer of electrically conductive material extending into said first pocket area;
said second face surface of said second housing segment includes a second pocket area, with said second layer of electrically conductive material extending into said second pocket area;
said first electrically conductive terminal pin means includes a connector section received in said first pocket area and in electrical contact with said first layer of electrically conductive material in said first pocket area; and
said second electrically conductive terminal pin means includes a connector section received in said second pocket area and in electrical contact with said second layer of electrically conductive material in said second pocket area.

29. The capacitor of claim 28 including:
at least one stabilizing pad on at least one of said housing segments, said stabilizing pad cooperating with a passage means to define the passage area for a terminal pin.

30. The capacitor of claim 28 including:
first and second inactive pins retained in said housing segments, said inactive pins being positioned to be electrically isolated from said first and second electrically conductive means and said first and second electrically conductive layers on said dielectric element and to balance said first and second terminal pins.

31. The capacitor of claim 30 including:

stabilizing pads on at least one of said first and second housing segments, said stabilizing pads cooperating with passage means to define passage areas for terminal pins and/or inactive pins.

32. The capacitor of claim 28 including:

first and second projecting lugs, said lugs being on at least one of said housing segments, said lugs being positioned to balance said first and second terminal pins.

33. The method of making a capacitor including the steps of:

forming a first molded housing segment having a first border segment around the periphery of said first molded housing segment;

forming a second molded housing segment having a second border segment around the periphery of said second molded housing segment;

said first and second housing segments being formed with mating moisture barrier segments in said first and second border segments and passage means in at least one of said border segments for passage of said first and second terminal pins;

at least one of said molded housing segments being formed with a recess therein;

said first and second molded housing segments cooperating to define within said border segments an interior cavity having opposed first and second face surfaces, said first face surface being on said first molded housing segment and said second face surface being on said second molded housing segment;

forming a first electrically conductive means associated with said first face surface and having a first terminal pin extending therefrom;

forming a second electrically conductive means associated with said second face surface and having a first terminal pin extending therefrom;

positioning a flat dielectric element in said cavity, said dielectric element having first and second opposed faces, with a first electrically conductive layer on said first face and a second electrically conductive layer on said second face; and bringing said first and second housing segments together and bonding them to each other with said first and second border segments in facing and abutting contact and with said moisture barrier segments in mating engagement;

said first electrically conductive means being physically and electrically connected to at least part of said first electrically conductive layer and said second electrically conductive layer and said second electrically conductive means being connected to at least part of said second electrically conductive layer upon completion of assembly of the capacitor.

34. The method of claim 33 including the step of:

forming at least one stabilizing pad on at least one of said housing segments, said stabilizing pad cooperating with a passage means to define the passage area for a terminal pin.

35. The method of claim 33 including the step of:

positioning first and second inactive pins in said housing segments, said inactive pins being positioned to be electrically isolated from said first and second electrically conductive means and said first and second electrically conductive layers on said dielectric element and to balance said first and second terminal pins.

36. The method of claim 35 including:

forming stabilizing pads on at least one of said first and second housing segments, said stabilizing pads cooperating with passage means to define passage areas for terminal pins and/or inactive pins.

37. The method of claim 33 including the step of:

forming first and second projecting lugs, said lugs being on at least one of said housing segments and being positioned to balance said first and second terminal pins.

38. The method of claim 33 wherein:

said first electrically conductive means is a first electrically conductive plate physically and electrically connected to said first electrically conductive layer on said dielectric element; and said second electrically conductive means in a second electrically conductive plate physically and electrically connected to said second electrically conductive layer on said dielectric element.

39. The method of claim 33 wherein:

said interior cavity is defined by a first recess in said first housing segment and a second recess in said second housing segment;

said first electrically conductive means is a first electrically conductive plate at least partly contained in said first recess and physically and electrically connected to said first electrically conductive layer on said dielectric element; and said second electrically conductive means is a second electrically conductive plate at least partly contained in said second recess and physically and electrically connected to said second electrically conductive layer on said dielectric element.

40. The method of forming a capacitor including the steps of:

forming a first molded housing segment having a first border segment around the periphery of said first molded housing segment;

forming a second molded housing segment having a second border segment around the periphery of said second molded housing segment;

said first and second housing segments being formed with mating moisture barrier means in said first and second border segments and passage means in at least one of said border segments for passage of said first and second terminal pins; and at least one of said molded housing segments being formed with a recess therein;

said first and second molded housing segments cooperating to define within said border segments an interior cavity having opposed first and second face surfaces, said first face surface being on said first molded housing segment and said second face surface being on said second molded housing segment;

forming a first layer of electrically conductive material on said first face surface of said first housing segment;

forming a second layer of electrically conductive material on said second face surface of said second housing segment;

positioning a flat dielectric element in said cavity, said dielectric element having first and second opposed faces, with a first electrically conductive layer on said first face and a second electrically conductive layer on said second face;

positioning first electrically conductive terminal pin means to be electrically connected to said first layer of electrically conductive material on said first face surface of said first housing element;

positioning second electrically conductive terminal pin means to be electrically connected to said second layer of electrically conductive material on said second face surface of said second housing element;

bringing said first and second housing segments together and bonding them to each other with said border segments in facing and abutting contact and with said moisture barrier segments in mating engagement;

said first layer of electrically conductive material on said first face surface of said first housing segment being physically and electrically connected to both said first electrically conductive layer on said dielectric element and to said first terminal pin, and said second layer of electrically conductive material on said second face surface of said second housing segment being physically and electrically connected both to said second electrically conductive layer on said dielectric element and to said second terminal pin.

41. The method of claim 40 including the step of:
forming at least one stabilizing pad on at least one of said housing segments, said stabilizing pad cooperating with a passage means to define the passage area for a terminal pin.

42. The method of claim 40 including the step of:
first and second inactive pins retained in said housing segments, said inactive pins being positioned to be electrically isolated from said first and second electrically conductive means and said first and second electrically conductive layers on said dielectric element and to balance said first and second terminal pins.

43. The method of claim 42 including the step of:
stabilizing pads on at least one of said first and second housing segments, said stabilizing pads cooperating with passage means to define passage areas for terminal pins and/or inactive pins.

44. The method of claim 40 including the step of:
forming first and second projecting lugs on at least one of said housing segments, said lugs being positioned to balance said first and second terminal pins.

45. The method of claim 40 wherein:
said first face surface of said first housing segment is formed with a first pocket area, with said first layer of electrically conductive material extending into said first pocket area;
said second face surface of said second housing segment is formed with a second pocket area, with said second layer of electrically conductive material extending into said second pocket area;
said first electrically conductive terminal pin means includes a connector section positioned in said first pocket area and in electrical contact with said first layer of electrically conductive material in said first pocket area; and
said second electrically conductive terminal pin means includes a connector section positioned in said second pocket area and in electrical contact with said second layer of electrically conductive material in said second pocket area.

46. The method of claim 45 including the step of:
forming at least one stabilizing pad on at least one of said housing segments, said stabilizing pad cooperating with a passage means to define the passage area for a terminal pin.

47. The method of forming a capacitor including the steps of:
forming a first molded housing segment having a first border segment around the periphery of said first molded housing segment;

forming a second molded housing segment having a second border segment around the periphery of said second molded housing segment;

forming a spacer element having a central opening, said spacer element having a border area around said opening with moisture barrier segments on opposite sides of the border area, said first and second housing segments being formed with moisture barrier means in said first and second border segments to mate with said moisture segments on said spacer element and passage means in at least one of said border segments for passage of said first and second terminal pins; and said first and second molded housing segments and said spacer element cooperating to define an interior cavity having opposed first and second face surfaces, said first face surface being on said first molded housing segment and said second face surface being on said second molded housing segment;

forming a first layer of electrically conductive material on said first face surface of said first housing segment;

forming a second layer of electrically conductive material on said second face surface of said second housing segment;

positioning a flat dielectric element in said cavity, said dielectric element having first and second opposed faces, with a first electrically conductive layer on said first face and a second electrically conductive layer on said second face;

positioning first electrically conductive terminal pin means to be electrically connected to said first layer of electrically conductive material on said first face surface of said first housing element;

positioning second electrically conductive terminal pin means to be electrically connected to said second layer of electrically conductive material on said second face surface of said second housing element;

bringing said first and second housing segments and said spacer element together with the spacer element between the housing segments and bonding said first and second border segments of said housing segments to opposite sides of said border area of said spacer and with said moisture barrier segments of said spacer and housing segments in mating engagement;

said first layer of electrically conductive material on said first face surface of said first housing segment being physically and electrically connected to both said first electrically conductive layer on said dielectric element and to said first terminal pin, and said second layer of electrically conductive material on said second face surface of said second housing segment being physically and electrically connected both to said second electrically conductive layer on said dielectric element and to said second terminal pin.

48. The method of claim 47 including the step of:

forming at least one stabilizing pad on at least one of said housing segments, said stabilizing pad cooperating with a passage means to define the passage area for a terminal pin.

49. The method of claim 47 including the step of:

first and second inactive pins retained in said housing segments, said inactive pins being positioned to be electrically isolated from said first and second electrically conductive means and said first and second electrically conductive layers on said dielectric element and to balance said first and second terminal pins.

50. The method of claim 49 including the step of:

stabilizing pads on at least one of said first and second housing segments, said stabilizing pads cooperating with passage means to define passage areas for terminal pins and/or inactive pins.

51. The method of claim 47 including the step of:

forming first and second projecting lugs on at least one of said housing segments, said lugs being positioned to balance said first and second terminal pins.

52. The method of claim 47 wherein:

said first face surface of said first housing segment is formed with a first pocket area, with said first layer of electrically conductive material extending into said first pocket area;

said second face surface of said second housing segment is formed with a second pocket area, with said second layer of electrically conductive material extending into said second pocket area;

said first electrically conductive terminal pin means includes a connector section positioned in said first pocket area and in electrical contact with said first layer of electrically conductive material in said first pocket area; and said second electrically conductive terminal pin means includes a connector section positioned in said second pocket area and in electrical contact with said second layer of electrically conductive material in said second pocket area.

53. The method of claim 52 including the step of:

forming at least one stabilizing pad on at least one of said housing segments, said stabilizing pad cooperating with a passage means to define the passage area for a terminal pin.

* * * * *